United States Patent [19]

Bogert et al.

[11] Patent Number: 4,506,264

[45] Date of Patent: Mar. 19, 1985

[54] FREQUENCY TRANSLATOR

[75] Inventors: Warren D. Bogert, Fort Lee; Marvin L. Kiss, Nutley, both of N.J.; Gin W. Yee, Flushing, N.Y.

[73] Assignee: International Telephone and Telegraph Corporation, New York, N.Y.

[21] Appl. No.: 872,419

[22] Filed: Jan. 26, 1978

[51] Int. Cl.³ .................... G01S 7/36; G01S 7/42; H01Q 15/18; H01Q 17/00
[52] U.S. Cl. ................................ 343/18 E; 343/17.7
[58] Field of Search ........................ 343/17.7, 18 E

[56] References Cited

U.S. PATENT DOCUMENTS

| | | | |
|---|---|---|---|
| 2,671,850 | 3/1954 | Marcou | 343/6.8 R X |
| 3,079,557 | 2/1963 | Crabtree | 343/6.8 R X |
| 3,226,714 | 12/1965 | Applegarth, Jr. | 343/6.8 R |
| 3,636,453 | 1/1972 | George | 343/6.8 R X |
| 3,683,279 | 8/1972 | Weinberg et al. | 343/6.8 R X |
| 3,715,509 | 2/1973 | Dawson | 343/55 A X |
| 3,921,121 | 11/1975 | Huisveld, Jr. et al. | 343/18 E X |
| 3,950,751 | 4/1976 | Orr et al. | 343/18 E |

*Primary Examiner*—Theodore M. Blum
*Attorney, Agent, or Firm*—John T. O'Halloran; Robert P. Seitter

[57] ABSTRACT

A frequency down-converter down converts an input signal having a frequency in a given bandwidth and a frequency up-converter up converts the down converted input signal and imparts a doppler shift to the up converted signal to generate an output signal having a frequency with doppler shift in the given bandwidth.

10 Claims, 1 Drawing Figure

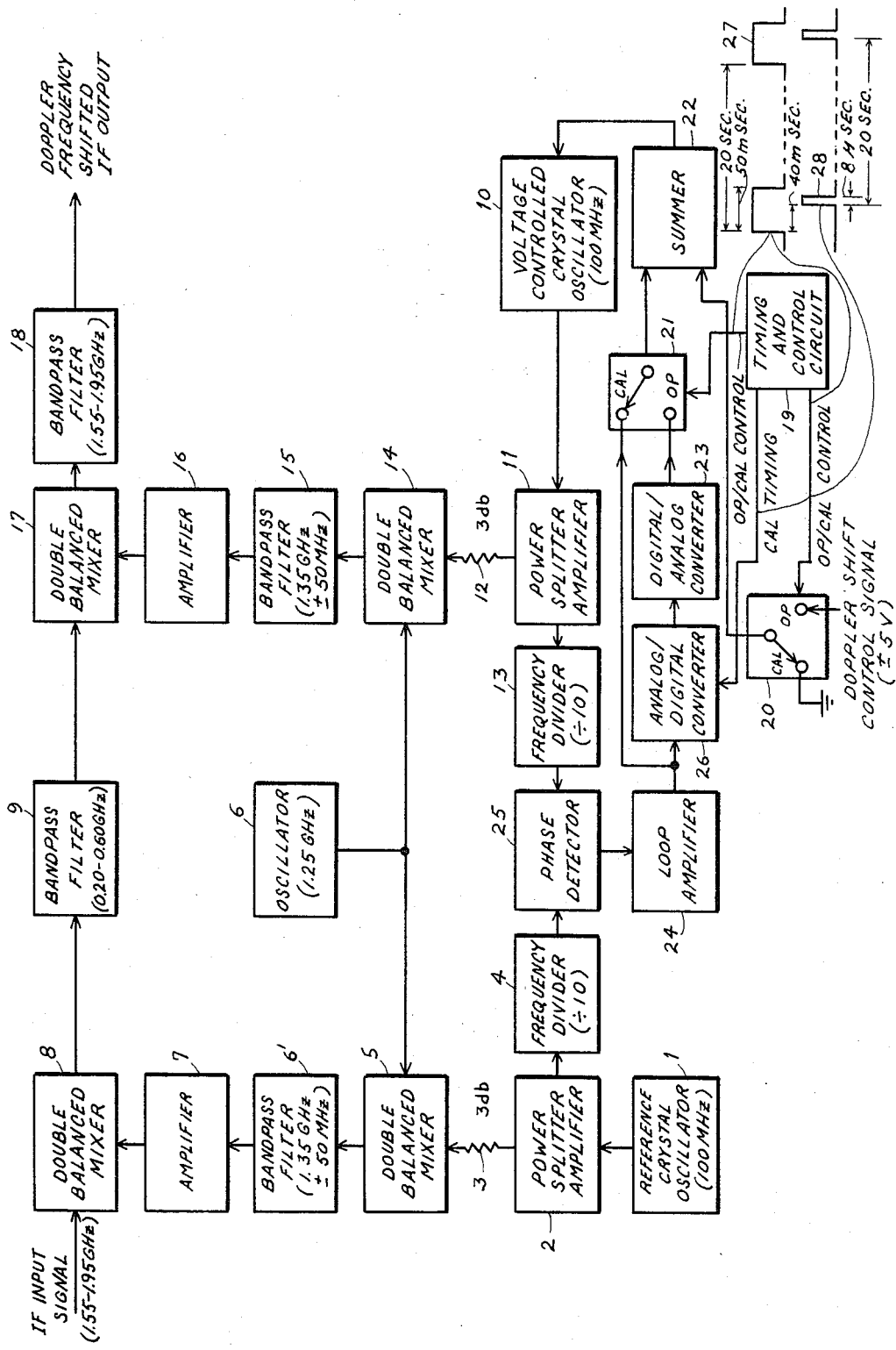

FREQUENCY TRANSLATOR

BACKGROUND OF THE INVENTION

This invention relates to frequency translators and more particularly to such translators that impart a doppler shift to the output signal thereof.

SUMMARY OF THE INVENTION

An object of the present invention is to provide an improved frequency translator to generate from an input signal having a frequency in a given bandwidth an output signal having a frequency with doppler shift in the given bandwidth.

A feature of the present invention is the provision of a frequency translator to generate from an input signal having a frequency in a given bandwidth an output signal having a frequency with doppler shift in the given bandwidth comprising: first means to frequency down-convert the input signal; and second means coupled to the first means to frequency up-convert the down-converted input signal and to impart a doppler shift to the up-converted signal to generate the output signal with doppler shift.

BRIEF DESCRIPTION OF THE DRAWING

Above-mentioned and other features and objects of this invention will become more apparent by reference to the following description taken in conjunction with the accompanying drawing, in which the single FIGURE is a block diagram of the frequency translator in accordance with the principles of the present invention.

DESCRIPTION OF THE PREFERRED EMBODIMENT

In accordance with the present invention, the technique utilized to introduce doppler shift in the transmitted signal to implement velocity deception includes down-converting and subsequently up-converting the input signal utilizing individual high purity, stable local oscillators whose frequency differs by an amount equal to the desired doppler frequency shift. In order to achieve high stability, the local oscillators include crystal controlled low frequency sources which are periodically matched in frequency through a phase locked loop. The crystal oscillators' output signals are then up-converted and filtered to provide the desired high purity, stable local oscillator signals.

Referring to the FIGURE the reference crystal oscillator 1 has an output signal whose frequency is 100 MHz (megahertz) which is coupled to a power splitter 2 having one output therefrom coupled to a 3 db (decibel) attenuator 3. The other output of power splitter amplifier 2 is coupled to a frequency divider 4 which divides the 100 MHz signal of oscillator 1 by a factor of ten. The output of attenuator 3 is coupled to a double balanced mixer 5 which receives a 1.25 GHz (gigahertz) signal from oscillator 6 to up-convert the 100 MHz signal of oscillator 1. The output of mixer 5 is a 1.35 GHz± 50 MHz signal which is filtered in bandpass filter 6'. The output signal of filter 6' is amplified in amplifier 7 and applied to double balanced mixer 8 which receives an IF input signal having a frequency in the range of 1.55–1.95 GHz. The output from mixer 8 is coupled to a bandpass filter 9 which has a bandpass of 0.20–0.60 GHz and passes the down-converted IF input signal.

The up-converting portion of the frequency translator of this invention includes a voltage controlled crystal oscillator 10 providing an output signal having a frequency of 100 MHz shifted in frequency by the doppler shift control signal coupled to summer 22. This signal is coupled to power splitter amplifier 11 with one output thereof being coupled to a 3 db attenuator 12 and the other output coupled to frequency divider 13 which divides by a factor of ten the 100 MHz frequency output signal of oscillator 10. The output of attenuator 12 is up-converted in double balanced mixer 14 by the 1.25 GHz output of oscillator 6. Mixer 14 produces an output signal having a frequency of 1.35 GHz± 50 MHz which is filtered in bandpass filter 15 whose output is amplified in amplifier 16. The output of amplifier 16 is coupled to double balanced mixer 17 which receives as its other input the output from bandpass filter 9 to provide an output signal from mixer 17 for coupling to bandpass filter 18 which passes a signal in the 1.55–1.95 GHz frequency range and provides a doppler frequency shifted IF output.

The difference between the IF frequency input signal and the IF output signals is precisely the difference between the frequencies of the two crystal controlled oscillators 1 and 10. The frequency conversion in mixers 5 and 14 is independent of the output frequency of oscillator 6 stability since it is common to both conversions. The crystal controlled oscillators 1 and 10 have a long term (one year) stability of 500 Hz (hertz) and a short term drift of less than 10 Hz in several seconds. To eliminate this drift, oscillators 1 and 10 are calibrated periodically. Once every 20 seconds, a calibration cycle is initiated by timing and control circuit 19 and switches 20 and 21. First the doppler shift control signal which varies from + to −5 volts is disengaged from the input to summer 22 and a ground is applied to this input of summer 22. Switch 21 switches the other input of summer 22 from the output of digital/analog converter 23 to the output of loop amplifier 24 of a phase locked loop. In this manner through phase detector 25, oscillator 10 is phase locked to oscillator 1. The phase locked loop includes phase detector 25, loop amplifier 24, analog/digital converter 26, digital/analog converter 23 and summer 22 coupled to the control input of oscillator 10. The control of switches 20 and 21 are illustrated in waveform 27 which shows that the switches 20 and 21, shown to be electromechanical switches, but which may be electronic switches, are controlled by a 50 millisecond pulse having a period of 20 seconds.

When the switches 20 and 21 are in their operation position, the doppler shift control signal is coupled to summer 22 and hence to the control input of oscillator 10 which imparts a frequency shift to the output signal of oscillator 10 which eventually results, after the up-conversion process of the down-converted input signal at the output of bandpass filter 9, in a doppler frequency shifted IF output from filter 18.

During the calibration cycle after the phase locked loop has stabilized, the error voltage from loop amplifier 24 is sampled and stored in the analog/digital converter 26 and digital/analog converter 23. The sampling of analog/digital converter 26 is accomplished by the waveform 28 which is produced by timing and control circuit 19. As illustrated, the sampling pulse of waveform 28 is delayed with respect to the 50 millisecond pulse of waveform 27 by 40 milliseconds and has a width of 8 microseconds and a period of 20 seconds. The implementation of timing and control circuit 19 may, for example, be by providing two pulse generators driven by a common synchronization clock with each of the pulse generators producing a different one of the signals 27 and 28. At the end of the calibration source, the sampled and held loop error voltage is switched to the summing input of summer 22 by switch 21.

In order to meet the requirements for effective velocity deception for certain threats, the doppler frequency shifted output signal must have a very high spectral purity. The suppression of the carrier frequency and of all the harmonic spectral components in the radar bandwidth must be at least 40 db below the desired signal level. The dual frequency translation technique employed in the system of the present invention to obtain the frequency translation is capable of providing such spectrum purity. The reference crystal oscillator 1 and the voltage controlled crystal oscillator 10 are inherently both high purity signal sources, where spurious components are in excess of 100 db below signal output 100 Hz away from center frequency in a 1 Hz bandwidth. The spectral products generated by mixing of the output signals of oscillators 1 and 10 with the output signal of oscillator 6' are eliminated by the bandpass filters 6' and 15. Thus, the local oscillator signal that is used to downconvert the 1.5-1.95 GHz IF input signal has a single significant spectral component at 1.35 GHz.

The measured noise spurious components for the 1.25 GHz local oscillator 6 is 80 db below center frequency, measured in a 1 Hz bandwidth, 1 KHz away from the center frequency. The 1.35 GHz local oscillator signal from filter 6 beating with the input IF signal in mixer 8 produces a lower sideband spectral line in the 0.20-0.60 GHz bandwidth of filter 9. All other frequency components, including mixing products derived from harmonics of the input signal beating with the local oscillator harmonics in mixer 8 are outside the bandpass of filter 9. Similarly, in the up-conversion process, filter 18 eliminates the local oscillator leakage and lower sideband spectral components.

Stability in the doppler shift is another essential parameter required to implement effective velocity deception. The minimum velocity gate bandwidth in continuous wave radars is in the order of 100 to 200 Hz. Therefore, in order to effectively capture and hold the gate, the doppler shift must have a short term stability in the order of 10 to 20 Hz.

One source of instability in the system is due to the relative frequency shift of oscillators 1 and 10. Manufacturers' data show drift rates of 10 Hz for short periods in the order of several seconds. The drift rate is in the order of 500 Hz in a period of one year. The phase locked loop provides correction for both long term and short term frequency drift by calibrating the frequency difference between oscillators 1 and 10 once every 20 seconds.

While we have described above the principles of our invention in connection with specific apparatus it is to be clearly understood that this description is made only by way of example and not as a limitation to the scope of our invention as set forth in the objects thereof and in the accompanying claims.

We claim:

1. A frequency translator to generate from an input signal having a frequency in a given bandwidth an output signal having a frequency with doppler shift in said given bandwidth comprising:

first means including a reference crystal oscillator to frequency down-convert said input signal; and second means coupled to said first means to frequency up-convert said down-converted input signal and to impart a doppler shift to said up-converted signal to generate said output signal with doppler shift, said second means including a voltage controlled crystal oscillator.

2. A translator according to claim 1, wherein said first means includes said reference crystal oscillator having a first given frequency, oscillator means having a second given frequency different than said first given frequency, a first mixer means coupled to said reference oscillator and said oscillator means, a first bandpass filter coupled to said first mixer means to produce a first local oscillator signal having a third given frequency, a second mixer means coupled to said first bandpass filter and receiving said input signal to frequency down-convert said input signal, and a second bandpass filter coupled to said second mixer means to pass said down-converted input signal.

3. A translator according to claim 2, wherein said second means includes said voltage controlled crystal oscillator having a nominal frequency equal to said first given frequency, a phase locked loop coupled to said voltage controlled crystal oscillator and said reference oscillator, a doppler shift control signal coupled to said phase locked loop to vary the frequency of said voltage controlled crystal oscillator to provide a frequency shift for the output frequency of said voltage controlled crystal ocsillator proportional to said doppler shift, a third mixer means coupled to said voltage controlled crystal oscillator and said oscillator means, a third bandpass filter coupled to said third mixer means to produce a second local oscillator signal having a frequency equal to said third given frequency shifted by said doppler shift, a fourth mixer means coupled to said second and third bandpass filters to receive said down-converted input signal and said second local oscillator signal to frequency up-convert said down-converted input signal, and a fourth bandpass filter coupled to said fourth mixer means to produce said output signal.

4. A translator according to claim 3, wherein each of said first, second, third and fourth mixer means include a double balanced mixer.

5. A translator according to claim 3, wherein said phase locked loop includes a phase detector coupled to said voltage controlled crystal oscillator and said reference crystal oscillator, a loop amplifier coupled to said phase detector, an analog/digital converter coupled to said loop amplifier, a digital/analog converter coupled to said analog/digital converter, and a summer having one input coupled to said digital/analog converter, another input to receive said doppler shift control signal and an output coupled to said voltage controlled crystal oscillator.

6. A translator according to claim 5, further including switch means to disconnect said digital/analog converter from said one input of said summer and to connect said one input of said summer to said loop amplifier and to disconnect said doppler shift control signal from said another input of said summer and to connect said another input of said summer to ground to enable calibration of said voltage controlled crystal oscillator at predetermined time intervals.

7. A translator according to claim 1, wherein said second means includes
- said voltage controlled crystal oscillator having a nominal frequency,
- a phase locked loop coupled to said voltage controlled crystal oscillator and said first means,
- a doppler shift control signal coupled to said phase locked loop to vary said nominal frequency of said voltage controlled crystal oscillator to provide a frequency shift for said nominal frequency of said voltage controlled crystal oscillator proportional to said doppler shift,
- a first mixer means coupled to said voltage controlled crystal oscillator and said first means,
- a first bandpass filter coupled to said first mixer means to produce a local oscillator signal frequency shifted by said doppler shift,
- a second mixer means coupled to said first means and said first bandpass filter to receive said down-converted input signal and said local oscillator signal to frequency up-convert said down-converted input signal, and
- a second bandpass filter coupled to said second mixer means to produce said output signal.

8. A translator according to claim 7, wherein each of said first and second mixer means include a double balanced mixer.

9. A translator according to claim 7, wherein said phase locked loop includes
- a phase detector coupled to said voltage controlled crystal oscillator and said first means,
- a loop amplifier coupled to said phase detector,
- an analog/digital converter coupled to said loop amplifier,
- a digital/analog converter coupled to said analog/digital converter, and
- a summer having one input coupled to said digital/analog converter, another input to receive said doppler shift control signal and an output coupled to said voltage controlled crystal oscillator.

10. A translator according to claim 9, further including
switch means to disconnect said digital/analog converter from said one input of said summer and to connect said one input of said summer to said loop amplifier and to disconnect said doppler shift control signal from said another input of said summer and to connect said another input of said summer to ground to enable calibration of said voltage controlled crystal oscillator at predetermined time intervals.

* * * * *